(12) United States Patent
Marbot et al.

(10) Patent No.: US 6,975,173 B2
(45) Date of Patent: Dec. 13, 2005

(54) TRANSFORMATION OF A PERIODIC SIGNAL INTO AN ADJUSTABLE-FREQUENCY SIGNAL

(75) Inventors: Roland Marbot, Sassenage (FR); Franck Hellard, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 112 days.

(21) Appl. No.: 10/662,180

(22) Filed: Sep. 12, 2003

(65) Prior Publication Data
US 2004/0056690 A1   Mar. 25, 2004

(30) Foreign Application Priority Data
Sep. 13, 2002   (FR) .................................. 02 11418

(51) Int. Cl.[7] .............................................. H03L 7/06
(52) U.S. Cl. ..................... 331/1 A; 331/16; 331/175; 331/25; 327/156; 327/158; 327/159
(58) Field of Search ........................... 331/1 A, 25, 17, 331/16, 57, 175; 327/156, 158, 159, 161

(56) References Cited

U.S. PATENT DOCUMENTS 5,550,514 A * 8/1996 Liedberg ..................... 331/1 A

FOREIGN PATENT DOCUMENTS

| EP | 0 901 227 A | 3/1999 |
| WO | WO 94 26032 A | 11/1994 |

OTHER PUBLICATIONS

French Search Report for 02/11418 dated May 20, 2003.

* cited by examiner

Primary Examiner—Arnold Kinkead
(74) Attorney, Agent, or Firm—Lisa K. Jorgenson; Bryan A. Santarelli; Graybeal Jackson Haley LLP

(57) ABSTRACT

A device for transforming a periodic input signal into an output signal of distinct frequency, comprising two adjustable delay means receiving the input signal, a multiplexer selecting the output signal of one or the other of the delay means, control means for, according to whether the output signal frequency must be smaller or greater than the input signal frequency, increasing or decreasing at the rate of the input signal, or at a multiple of this rate, the delay of the selected delay means, and controlling a minimum or maximum delay for the delay means which has not been selected, and a phase comparator adapted to changing the multiplexer selection when the transitions of the signals output by the delay means corresponding to a same transition of the input signal are offset by a duration greater than or equal to one period of the input signal.

25 Claims, 3 Drawing Sheets

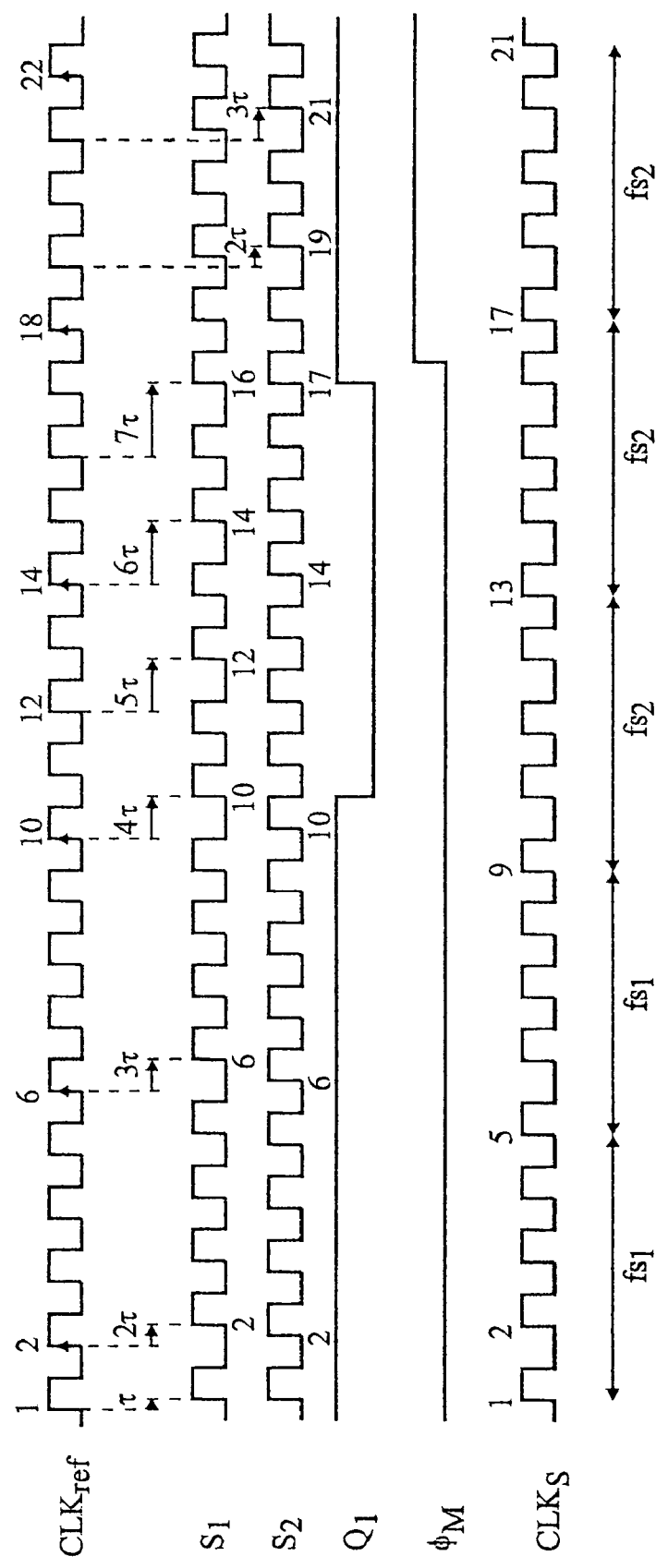

TRANSFORMATION OF A PERIODIC SIGNAL INTO AN ADJUSTABLE-FREQUENCY SIGNAL

PRIORITY CLAIM

This application claims priority from French patent application No. 02/11418, filed Sep. 13, 2002, which is incorporated herein by reference.

BACKGROUND OF THE INVENTION

1. Field of the Invention

The present invention relates generally to devices for transforming a periodic reference signal into a signal of adjustable frequency.

2. Discussion of the Related Art

Such devices are for example used in circuits of serial data transmission between a computer and hard disks.

The data to be transmitted come from the computer core in parallel on each transmission circuit generally via a so-called PCI (peripheral communication interface) bus. At the output of each transmission circuit, a serializer transmits serial data onto a connection cable such as a coaxial cable or an fiber optic connection.

To limit electromagnetic emission upon transmission of data on the connection cables, the serial data may be transmitted at variable frequency. Conventionally, the transmit frequency varies between a reference frequency, for example, 1 GHz, and a frequency slower by at most 5%, for example, 995 MHz. The frequency modulation is periodic, the modulation frequency currently ranging between 30 and 33 kHz.

Based on a reference clock signal, which oscillates at the reference frequency, a transformation device provides a clock signal having a serialization frequency controlling the serializer.

Some known frequency transformation devices are formed with a phase-locked loop or PLL.

A disadvantage of such devices is that their surface area may be very large.

Further, such devices generally comprise analog circuits: a voltage-controlled oscillator and a low-pass filter. The analog circuits typically must be adapted to each integrated circuit technology, and the operation of such circuits in all possible configurations, especially of temperature, manufacturing process, and supply voltage, poses more problems than that of all-digital circuits.

SUMMARY OF THE INVENTION

One embodiment of the present invention provides a frequency-transformation device of low bulk.

Another embodiment of the present invention provides such a device, which is entirely digital.

Another embodiment of the present invention provides such a device of simple structure.

More specifically, an embodiment of the present invention is a device for transforming a periodic input signal into an output signal of distinct frequency, comprising two adjustable delay means receiving the input signal, the difference between the maximum and minimum delays of each delay means being greater than one period of the input signal, a multiplexer selecting the output signal of one or the other of the delay means, control means for, according to whether the frequency of the output signal must be smaller or greater than the frequency of the input signal, increasing or decreasing at the rate of the input signal, or at a multiple of this rate, the delay of the selected delay means, and controlling a minimum or maximum delay for the delay means which has not been selected, and a phase comparator adapted to changing the multiplexer selection when the transitions of the signals output by the delay means corresponding to a same transition of the input signal are offset by a duration greater than or equal to one period of the input signal.

According to an embodiment of such a transformation device, the control means comprise means for setting the increase or decrease rate of the delay of the delay means.

According to an embodiment of such a transformation device, the delay of the delay means is capable of varying by increments or decrements and the control means comprise means for setting the increment or decrement value.

According to an embodiment of such a transformation device, each delay means comprises several delay elements in series, the output of each delay element being connected to the output of the delay means via a switch, the input of the first delay element being connected to the input of the delay means.

According to an embodiment of such a transformation device, the phase comparator comprises two NAND gates with two inputs, the output of a NAND gate being connected to a first input of the other NAND gate, each NAND gate receiving on its second input one of the output signals of said delay means, one of these signals being transmitted to the control input of a first flip-flop via a non-inverting circuit exhibiting a delay, the output of one of the NAND gates being connected to the data input of the first flip-flop, the output of the first flip-flop controlling a second flip-flop having its output connected to its input via an inverter, the output of the second flip-flop controlling the multiplexer of the transformation device.

According to an embodiment of such a transformation device, the delay of one of the delay means increases or decreases only during one or several cycles of a set of cycles of the input signal, the number of increases or decreases of the delay over a set of cycles being all the greater as the frequency of the output signal is remote from the frequency of the input signal.

BRIEF DESCRIPTION OF THE DRAWINGS

Features and advantages of the present invention will be discussed in detail in the following non-limiting description of specific embodiments in connection with the accompanying drawings.

FIG. 5 is a diagram illustrating the signals at various points of the device of FIG. 1 according to an alternative use of the device according to an embodiment of the present invention.

DETAILED DESCRIPTION

Figure 1:
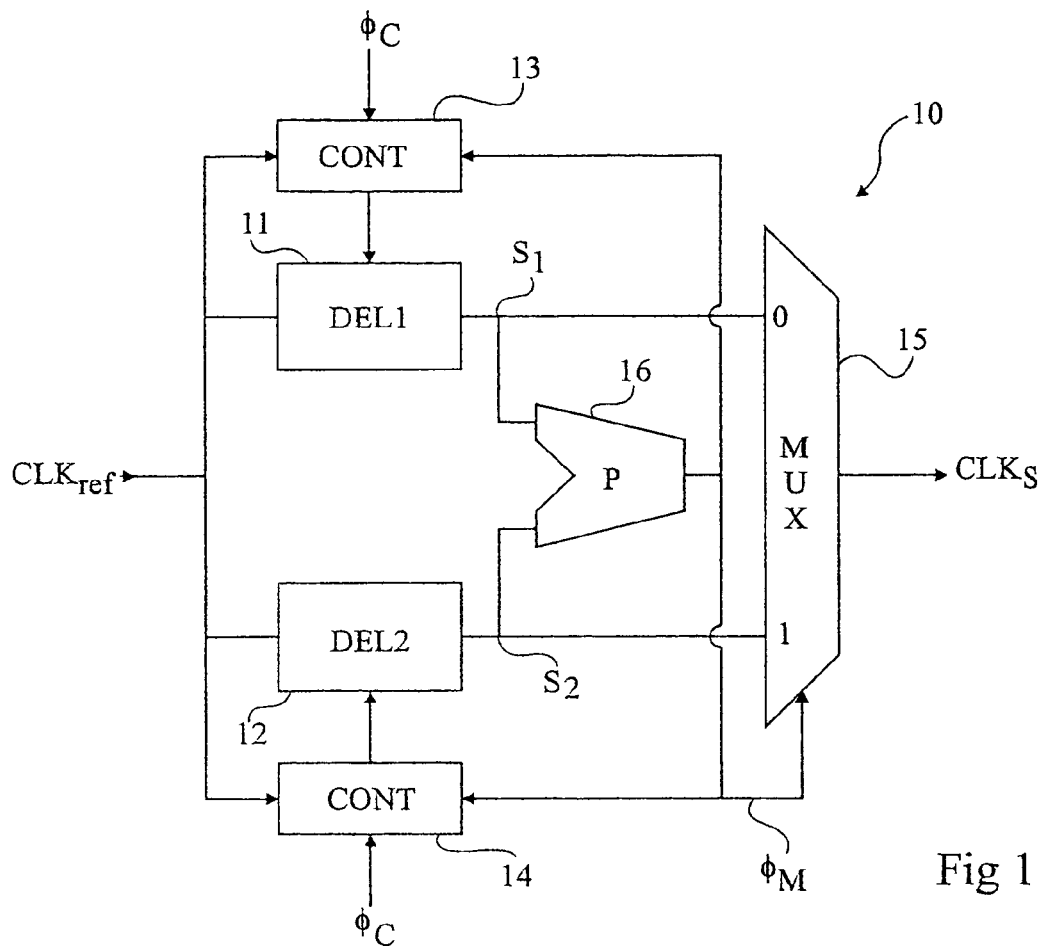
FIG. 1 is a diagram of a frequency-transformation device according to an embodiment of the present invention.

FIG. 1 is a diagram of a device 10 for transforming a reference clock signal $CLK_{ref}$ of frequency $f_{ref}$ and of period T into a clock signal $CLK_s$ of frequency $f_s$ different from $f_{ref}$. Device 10 comprises two adjustable delay means 11 (DEL1) and 12 (DEL2), which receive signal $CLK_{ref}$ and respectively provide signals $S_1$ and $S_2$. Signal $S_1$ is delayed with respect to $CLK_{ref}$ by a delay DEL1 adjustable by a control of a control circuit (CONT) 13. Signal $S_2$ is delayed with respect to $CLK_{ref}$ by a delay DEL2 adjustable by a control of a control circuit (CONT) 14. A multiplexer (MUX) 15 receives signal $S_1$ on its "0" input and signal $S_2$ on its "1" input. A selection signal $\Phi_M$ controls multiplexer 15 which provides clock signal CLKs. A phase comparator (P) 16 receives signals $S_1$ and $S_2$ and provides selection signal $\Phi_M$. Control circuits 13 and 14 are identical and receive clock signal $CLK_{ref}$, selection signal $\Phi_M$, as well as a control signal $\Phi_C$ indicating the desired frequency.

Figure 2:
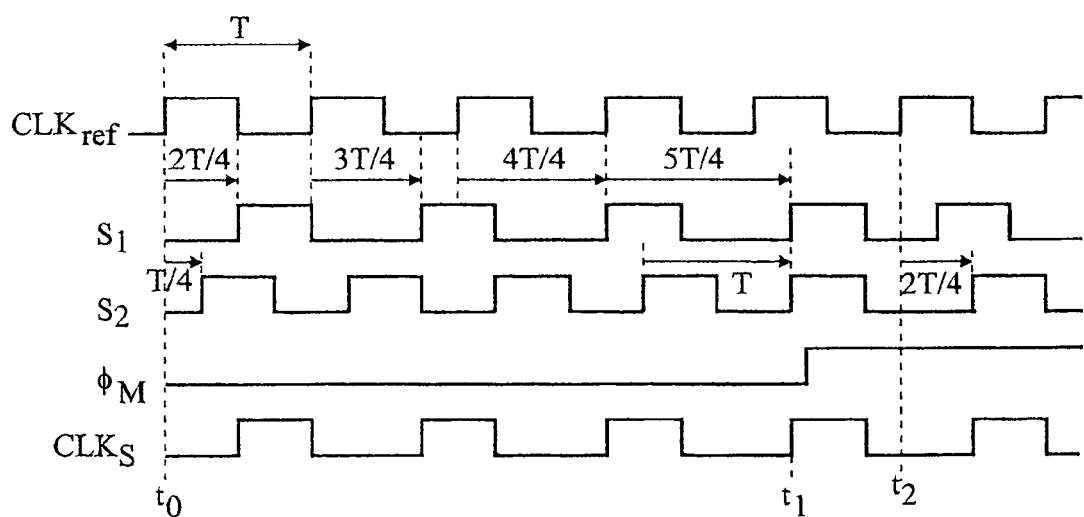
FIG. 2 is a diagram illustrating the shape of the signals at various points of the device of FIG. 1 according to an embodiment of the present invention.

FIG. 2 is a diagram of signals $CLK_{ref}$, $S_1$, $S_2$, $\Phi_M$ and $CLK_s$ of the device of FIG. 1, in the case where the searched frequency $f_s$ is smaller than reference frequency $f_{ref}$. Reference clock signal $CLK_{ref}$ is periodic, with in this example a duty cycle of 50%. Six full periods of $CLK_{ref}$ are shown in FIG. 2. Initially, at a time $t_0$, selection signal $\Phi_M$ is at level "0" and signal $S_1$ is selected. Delay DEL2 of delay means 12 is minimum and equal to T/4. Delay DEL1 of delay means 11 progressively increases by T/4, at frequency $f_{ref}$. The first shown rising edges of signals $S_1$ and $CLK_{ref}$ are offset by one half reference period (2T/4). The $2^{nd}$ rising edges of signals $S_1$ and $CLK_{ref}$ are offset by 3T/4. The $3^{rd}$ rising edges of signals $S_1$ and $CLK_{ref}$ are offset by T. The $4^{th}$ rising edges of signals $S_1$ and $CLK_{ref}$ are offset by 5T/4.

During all this time, signal $S_2$ is offset by T/4 with respect to signal $CLK_{ref}$. Multiplexer 15 provides signal $S_1$ until the fourth rising edge of $S_1$ comes up. At this time $t_1$, the $4^{th}$ rising edges of signals $S_1$ and $S_2$ corresponding to the offset of the fourth rising edge of signal $CLK_{ref}$ are offset by one reference period T. Phase comparator 16 then switches selection signal $\Phi_M$ from 0 to 1 and the multiplexer selects signal $S_2$. At the next rising edge of signal $CLK_{ref}$, that is, at the sixth rising edge shown at a time $t_2$, delay DEL2 of delay means 12 is increased and the $6^{th}$ rising edges of signals $S_2$ and $CLK_{ref}$ are offset by one half reference period (2T/4) while delay DEL1 remains constant and equal to T/4.

Delay DEL2 increases until the rising edges of signals $S_1$ and $S_2$ corresponding to a same rising edge of $CLK_{ref}$ are offset by period T. At this time, the selection switches back.

The period of clock signal $CLK_s$ is thus equal in this example to one reference period plus one quarter, that is, 5T/4. Frequency $f_s$ thus is equal to 800 MHz when the reference frequency is 1 GHz.

Phase comparator 16 of transformation device 10 of FIG. 1 thus has the function of detecting the time at which the rising edges of signals $S_1$ and $S_2$ corresponding to a same rising edge of clock signal $CLK_{ref}$ are offset by a duration greater than or equal to one reference period T. Phase comparator 16 then changes the level of selection signal $\Phi_M$. The previously-selected delay means takes a minimum delay (T/4). The delay of the newly selected delay means increases.

Generally, phase comparator 16 can detect the time at which determined transitions, a rising or falling edge, of signals $S_1$ and $S_2$ corresponding to a same transition of signal $CLK_{ref}$, are offset by at least one period T.

Control circuits 13 and 14 may be formed by means of a finite state machine adapted to increasing the delay of the selected delay means at the rate of signal $CLK_{ref}$ and positioning the other delay means on the minimum delay.

Figure 3:
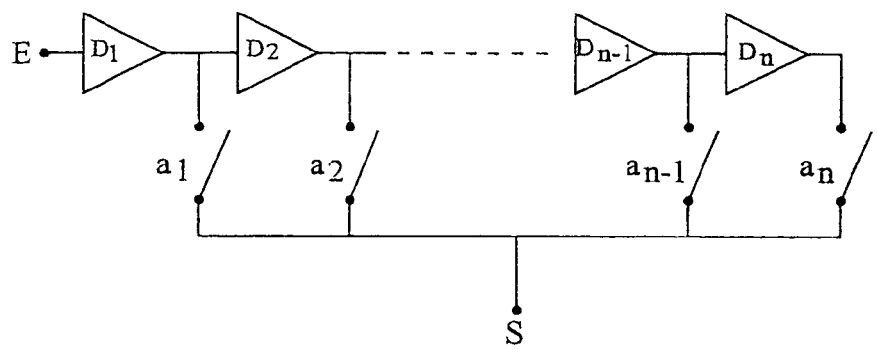
FIG. 3 is a diagram of an embodiment of a delay means of the device according to an embodiment of the present invention.

FIG. 3 is a diagram of an embodiment of delay means 11, 12 used in transformation device 10 according to the present invention. The delay means comprises n delay elements $D_1$ to $D_n$ in series, input E of the delay means being connected to the input of delay element $D_1$. A delay element may for example be formed of two inverters in series. The output of a delay element $D_i$, i ranging between 1 and n, is connected to output S of the delay means via a switch $a_i$. The minimum delay between E and S is obtained by turning on switch $a_1$ and by turning off all the other switches. The delay between E and S can be progressively increased by successively selecting switches $a_2$, $a_3$, and so on.

The number of delay elements is such that the difference between the maximum delay obtained by selecting switch an and the minimum delay obtained by selecting switch $a_1$ is greater than one reference period T to ensure a proper operation of device 10. The selected delay means changes at the latest when the delay of the selected delay means is maximum.

There also exist more sophisticated delay means, such as that described in French patent application 9711022 of the applicant. This French patent is incorporated by reference.

Figure 4:
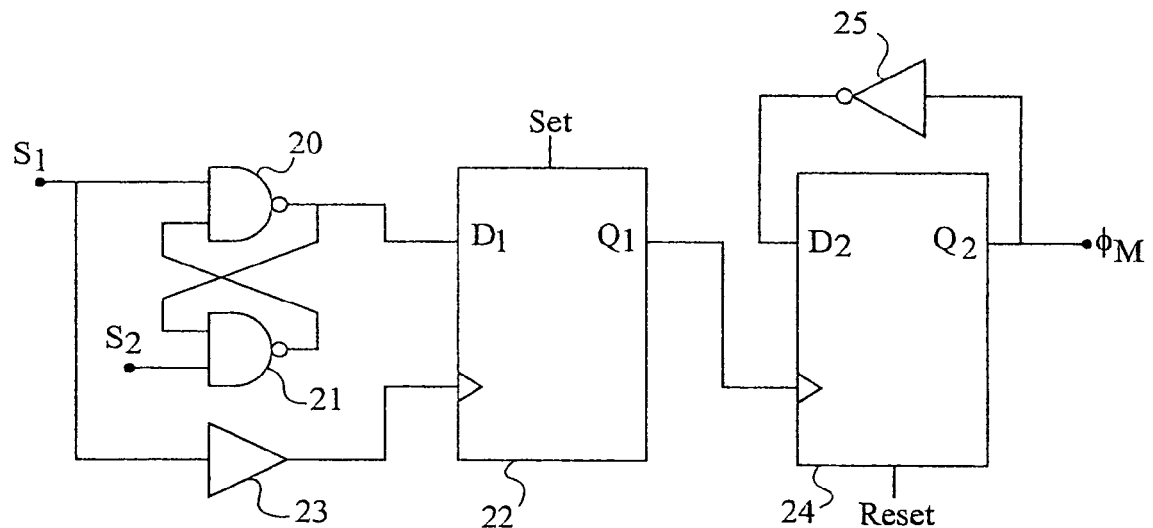
FIG. 4 is a diagram of an embodiment of the phase comparator of the device according to an embodiment of the present invention.

FIG. 4 is a diagram of an embodiment of phase comparator 16 of the transformation device of the present invention. Phase comparator 16 comprises two NAND gates 20 and 21 with two inputs. The output of NAND gate 20 is connected to an input of NAND gate 21 and the output of NAND gate 21 is connected to an input of NAND gate 20. The second input of NAND gate 20 receives signal $S_1$ and the second input of NAND gate 21 receives signal $S_2$. Signal $S_1$ is transmitted to the control input of a flip-flop 22 via a non-inverting circuit 23 exhibiting a given delay. The output of NAND gate 20 is connected to data input $D_1$ of flip-flop 22. Output $Q_1$ of flip-flop 22 controls a flip-flop 24 assembled as a counter, output $Q_2$ of flip-flop 24 being connected to its data input $D_2$ via an inverter 25. Output $Q_2$ of flip-flop 24 provides selection signal $\Phi_M$ which controls multiplexer 15 of frequency transformation device 10.

Outputs $Q_1$ and $Q_2$ of flip-flops 22 and 24 are initially positioned at "1" and "0" via for example initialization signals (set, reset). As long as signals $S_1$ and $S_2$ are offset by less than one half-period (T/2), output $Q_1$ of flip-flop 22 remains at 1. At the time when the offset of signals $S_1$ and $S_2$ exceeds one half period, output $Q_1$ of flip-flop 20 switches from 1 to 0. As long as the offset of signals $S_1$ and $S_2$ remains between one half-period (T/2) and one period T, output $Q_1$ of flip-flop 20 remains at 0. Then, when signals $S_1$ and $S_2$ are offset by at least one period T, output $Q_1$ of flip-flop 22 switches from 0 to 1. Output $Q_2$ of flip-flop 24 switches state. Since selection signal $\Phi_M$ switches state, the selection of multiplexer 15 inverts. Signals $S_1$ and $S_2$ are progressively offset again and output $Q_1$ of flip-flop 22 switches back from 1 to 0 and from 0 to 1 and the multiplexer selection inverts again.

FIG. 5 illustrates, as an example, another possible diagram of the signals of the transformation device 10 according to another embodiment of the present invention. In the case where a variable frequency $f_s$ relatively close to $f_{ref}$ is desired to be obtained, it becomes impractical to form a delay means such as shown in FIG. 3 with delay elements having a very small propagation time, for example, on the order of $1/f_s$. Recent technologies of integrated-circuit manufacturing indeed enable forming delay elements having a propagation time at least equal to 10 ps. This embodiment of the present invention then provides a means for providing a clock signal $CLK_s$ having over X clock cycles an average frequency equal to the desired frequency $f_s$.

The diagram of FIG. 5 is obtained with delay means each formed of six delay elements having an identical propagation time τ taken to be equal in the example to ⅙ of reference period T of signal $CLK_{ref}$. The $1^{st}$ shown rising edges of signals $S_1$ and $CLK_{ref}$ are offset by τ. Delay DEL1 is then increased and becomes 2τ. The $2^{nd}$ rising edges of signals $S_1$ and $CLK_{ref}$ are thus offset by 2τ. Delay DEL1 is then unchanged for three cycles of signal $CLK_{ref}$. $\Phi_M$ being initially zero, multiplexer 15 provides signal $S_1$. Clock signal $CLK_s$ has over its first four shown cycles, an average period equal to 5T/4, which corresponds to an average frequency $f_{s1}$ of (⅘)*$f_{ref}$.

The $6^{th}$ rising edges of signals $S_1$ and $CLK_{ref}$ are offset by 3τ. Delay DEL1 of delay means 11 is then constant for the next three cycles of signal $CLK_{ref}$. The average frequency of clock signal $CLK_s$ between its $9^{th}$ and $6^{th}$ rising edges is identical to the frequency between its $1^{st}$ and $4^{th}$ rising edges and is equal to $f_{s1}$.

The $10^{th}$ and $11^{th}$ rising edges of signals $S_1$ and $CLK_{ref}$ are offset by 4τ. Then, a new increase in delay DEL1 is performed on the $12^{th}$ cycle of signal $CLK_{ref}$, and the $12^{th}$ and $13^{th}$ rising edges of signals $S_1$ and $CLK_{ref}$ are offset by 5τ. Within four cycles of signal $CLK_s$, two increments equal to τ have been performed, its average frequency $f_{s2}$ is then smaller and equal to (⅔)*$f_{ref}$.

Similarly, an increment of delay DEL1 is performed for the $14^{th}$ and $16^{th}$ cycles of $CLK_{ref}$. The $14^{th}$ and $15^{th}$ rising edges of signals $S_1$ and $CLK_{ref}$ are offset by 6τ and their $16^{th}$ and $17^{th}$ rising edges are offset by 7τ. The average frequency of signal $CLK_s$ between its $13^{th}$ and $17^{th}$ rising edges is then equal to $f_{s2}$.

During all this period, between the $1^{st}$ and the $16^{th}$ rising edge of signal $CLK_s$, signal $S_2$ follows signal $CLK_{ref}$ with a minimum delay DEL2 equal to τ. Output $Q_1$ of flip-flop 22 of phase comparator 16 is initially at 1. Then, when signals $S_1$ and $S_2$ are in phase opposition, that is, on the $10^{th}$ rising edge of signal $S_1$, output $Q_1$ switches to zero. At the time when signals $S_1$ and $S_2$ are back in phase, that is, on the $16^{th}$ rising edge of signal $S_1$ and the $17^{th}$ rising edge of signal $S_2$, output $Q_1$ switches to one, and selection signal $\Phi_M$ initially at "0" switches to "1". Multiplexer 15 provides signal $S_2$. Delay DEL1 is then made minimum and equal to τ, and delay DEL2 will increase. The $19^{th}$ and $20^{th}$ rising edges of signals $S_2$ and $CLK_{ref}$ are offset by 2τ and their $21^{st}$ and $22^{nd}$ rising edges are offset by 3τ. Frequency $f_s$ of signal $CLK_s$ between its $17^{th}$ and $21^{st}$ rising edges is thus equal to $f_{s2}$.

Of course, the above-described embodiments of the present invention are likely to have various alterations, modifications, and improvement which will readily occur to those skilled in the art. In particular, a transformation device according to an embodiment of the present invention may be used to provide a clock signal $CLK_s$ having a frequency $f_s$ higher than frequency $f_{ref}$ of reference clock signal $CLK_{ref}$. For this purpose, delays DEL1 and DEL2 of delay means 11 and 12 will be initially maximum. Then the delay of the selected delay means will be progressively decreased, the delay of the other delay means remaining maximum. When the two signals $S_1$ and $S_2$ will be back in phase, the selection reverses.

Further, those skilled in the art will know how to form other delay means and other phase comparators. For example, one may design the delay means DEL2 so that it does not initially delay the signal S2 relative to $CLK_{ref}$.

Moreover, a transformation device—such as the device 10 of FIG. 1—according to an embodiment of the invention may be incorporated in an integrated circuit such as a serial-data transmitter or receiver. And such an IC may be incorporated into an electronic system such as a computer system or a data-transmission system.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for transforming a periodic input signal into an output signal of distinct frequency, comprising:
   two adjustable delay means receiving the input signal, the difference between the maximum and minimum delays of each delay means being greater than one period of the input signal;
   a multiplexer selecting the output signal of one or the other of the delay means;
   control means for, according to whether the frequency of the output signal must be smaller or greater than the frequency of the input signal, increasing or decreasing at the rate of the input signal, or at a multiple of this rate, the delay of the selected delay means, and controlling a minimum or maximum delay for the delay means which has not been selected, and
   a phase comparator adapted to changing the multiplexer selection when the transitions of the signals output by the delay means corresponding to a same transition of the input signal are offset by a duration greater than or equal to one period of the input signal.

2. The transformation device of claim 1, wherein the control means comprise means for setting the increase or decrease rate of the delay of the delay means.

3. The transformation device of claim 1, wherein the delay of the delay means varies by increments or decrements and the control means comprise means for setting the increment or decrement value.

4. The transformation device of claim 1, wherein each delay means comprises several delay elements in series, the output of each delay element being connected to the output of the delay means via a switch, the input of the first delay element being connected to the input of the delay means.

5. The transformation device of claim 1, wherein the phase comparator comprises two NAND gates with two inputs, the output of a NAND gate being connected to a first input of the other NAND gate, each NAND gate receiving on its second input one of the output signals of said delay means, one of these signals being transmitted to the control input of a first flip-flop via a non-inverting circuit exhibiting a delay, the output of one of the NAND gates being connected to the data input of the first flip-flop, the output of the first flip-flop controlling a second flip-flop, having its output connected to its input via an inverter, the output of the second flip-flop controlling the multiplexer of the transformation device.

6. The transformation device of claim 1, wherein the delay of one of the delay means increases or decreases only during one or several cycles of a set of cycles of the input signal, the number of increases or decreases of the delay over a set of cycles being all the greater as the frequency of the output signal is remote from the frequency of the input signal.

7. A circuit, comprising:
   an input node operable to receive a reference signal having a reference frequency and a reference phase;
   an output node;

a signal generator coupled to the input node and operable to generate from the reference signal during a first operational mode a first signal having a first phase that varies from the reference phase and having a first frequency that is different from the reference frequency, and operable to generate from the reference signal during a second operational mode a second signal having a second phase that varies from the reference phase and having a second frequency that is different from the reference frequency; and a signal selector coupled to the signal generator and, in response to the first and second phases, operable to,
select the mode of operation,
couple the first signal to the output node during the first mode of operation, and
couple the second signal to the output node during the second mode of operation.

8. A circuit, comprising:

an input node operable to receive a reference signal having a reference phase;

an output node;

a signal generator coupled to the input node and operable to generate from the reference signal a first signal having a first phase that varies from the reference phase during a first operational mode and a second signal having a second phase that varies from the reference phase during a second operational mode;

a signal selector coupled to the signal generator and, in response to the first and second phases, operable to,
select the mode of operation,
couple the first signal to the output node during the first mode of operation, and
couple the second signal to the output node during the second mode of operation;

wherein the signal generator increases a difference between the first and reference phases and maintains constant a difference between the second and reference phases during the first operational mode; and wherein the signal generator increases the difference between the second and reference phases and maintains constant the difference between the first and second reference phases during the second operational mode.

9. A circuit, comprising:

an input node operable to receive a reference signal having a reference phase;

an output node;

a signal generator coupled to the input node and operable to generate from the reference signal a first signal having a first phase that varies from the reference phase during a first operational mode and a second signal having a second phase that varies from the reference phase during a second operational mode;

a signal selector coupled to the signal generator and, in response to the first and second phases, operable to,
select the mode of operation,
couple the first signal to the output node during the first mode of operation, and
couple the second signal to the output node during the second mode of operation;

wherein during the first operational mode the signal generator varies the difference between the first and reference phases at least once per cycle of the reference signal; and wherein during the second operational mode the signal generator varies the difference between the second and reference phases at least once per cycle of the reference signal.

10. A circuit, comprising:

an input node operable to receive a reference signal having a reference phase;

an output node;

a signal generator coupled to the input node and operable to generate from the reference signal a first signal having a first phase that varies from the reference phase during a first operational mode and a second signal having a second phase that varies from the reference phase during a second operational mode;

a signal selector coupled to the signal generator and, in response to the first and second phases, operable to,
select the mode of operation,
couple the first signal to the output node during the first mode of operation, and
couple the second signal to the output node during the second mode of operation;

wherein during the first operational mode the signal generator varies the difference between the first and reference phases at least once but less than once per cycle of the reference signal; and wherein during the second operational mode the signal generator varies the difference between the second and reference phases at least once but less than once per cycle of the reference signal.

11. A circuit, comprising:

an input node operable to receive a reference signal having a reference phase;

an output node;

a signal generator coupled to the input node and operable to generate from the reference signal a first signal having a first phase that varies from the reference phase during a first operational mode and a second signal having a second phase that varies from the reference phase during a second operational mode;

a signal selector coupled to the signal generator and, in response to the first and second phases, operable to,
select the mode of operation,
couple the first signal to the output node during the first mode of operation, and
couple the second signal to the output node during the second mode of operation;

wherein the signal generator is further operable to,
generate first edges of the first signal in response to corresponding reference edges of the reference signal, and
generate second edges of the second signal in response to the corresponding reference edges of the reference signal; and wherein the signal selector is further operable to,
select the first operational mode when the first edges of the first signal lag the second edges of the second signal by less than one cycle of the reference signal, and
select the second operational mode when the second edges of the second signal lag the first edges of the first signal by less than one cycle of the reference signal.

12. An integrated circuit, comprising:

a clock generator operable to generate a clock signal, the clock generator comprising,
an input node operable to receive a reference signal having a reference phase and a reference frequency,
an output node,
a signal generator coupled to the input node and operable to generate from the reference signal during a first operational mode a first signal having a first phase that varies from the reference phase and having a first frequency that is different from the reference frequency, and operable to generate from the reference signal during a second operational mode a second signal having a second phase that varies from the reference phase and having a second frequency that is different from the reference frequency, and a signal selector coupled to the signal generator and, in response to the first and second phases, operable to, select the mode of operation, couple the first signal to the output node as the clock signal during the first mode of operation, and couple the second signal to the output node as the clock signal during the second mode of operation.

13. An integrated circuit, comprising:
a clock generator operable to generate a clock signal, the clock generator comprising,
an input node operable to receive a reference signal having a reference phase,
an output node,
a signal generator coupled to the input node and operable to generate from the reference signal during a first operational mode a first signal having a first phase that varies from the reference phase, and operable to generate from the reference signal during a second operational mode a second signal having a second phase that varies from the reference phase, and
a signal selector coupled to the signal generator and, in response to the first and second phases, operable to, select the mode of operation,
couple the first signal to the output node as the clock signal during the first mode of operation, and
couple the second signal to the output node as the clock signal during the second mode of operation; and
a transmitter coupled to the clock generator and operable to transmit data in synchronization with the clock signal.

14. An electronic system, comprising:
an integrated circuit, comprising,
a clock generator operable to generate a clock signal, the clock generator comprising,
an input node operable to receive a reference signal having a reference phase and a reference frequency,
an output node,
a signal generator coupled to the input node and operable to generate from the reference signal during a first operational mode a first signal having a first phase that varies from the reference phase and having a first frequency different from the reference frequency and operable to generate from the reference signal during a second operational mode a second signal having a second phase that varies from the reference phase and having a second frequency different from the reference frequency and
a signal selector coupled to the signal generator and, in response to the first and second phases, operable to,
select the mode of operation,
couple the first signal to the output node as the clock signal during the first mode of operation, and
couple the second signal to the output node as the clock signal during the second mode of operation.

15. An electronic system, comprising:
an integrated circuit, comprising,
a clock generator operable to generate a clock signal, the clock generator comprising,
an input node operable to receive a reference signal having a reference phase,
an output node,
a signal generator coupled to the input node and operable to generate from the reference signal a first signal having a first phase that varies from the reference phase during a first operational mode and a second signal having a second phase that varies from the reference phase during a second operational mode, and
a signal selector coupled to the signal generator and, in response to the first and second phases, operable to, select the mode of operation,
couple the first signal to the output node as the clock signal during the first mode of operation, and
couple the second signal to the output node as the clock signal during the second mode of operation, and
a transmitter that is operable to clock transmitted data with the clock signal.

16. A method, comprising:
varying a phase of a first signal relative to a phase of a reference signal, the first signal having a first average frequency that is different from the frequency of the reference signal; and
varying a phase of a second signal relative to the phase of the reference signal when the phase of the second signal has a predetermined relationship to the phase of the first signal, the second signal having a second average frequency that is different from the frequency of the reference signal.

17. A method, comprising:
varying a phase of a first signal relative to a phase of a reference signal;
varying a phase of a second signal relative to the phase of the reference signal when the phase of the second signal has a predetermined relationship to the phase of the first signal;
wherein varying the phase of the first signal relative to the phase of the reference signal comprises incrementing the phase of the first signal relative to the phase of the second signal; and
varying the phase of the second signal relative to the phase of the reference signal comprises incrementing the phase of the second signal relative to the phase of the first signal.

18. A method, comprising:
varying a phase of a first signal relative to a phase of a reference signal;
varying a phase of a second signal relative to the phase of the reference signal when the phase of the second signal has a predetermined relationship to the phase of the first signal;
wherein varying the phase of the second signal relative to the phase of the reference signal comprises varying the phase of the second signal when a difference between the phases of the first and second signals transitions from being less than one period of the second signal to being equal to or greater than one period of the second signal.

19. A method, comprising:
varying a phase of a first signal relative to a phase of a reference signal;

varying a phase of a second signal relative to the phase of the reference signal when the phase of the second signal has a predetermined relationship to the phase of the first signal; and wherein varying the phase of the second signal relative to the phase of the reference signal comprises varying the phase of the second signal when a difference between the phases of the first and second signals transitions from being less than one period of the reference signal to being equal to or greater than one period of the reference signal.

20. A method for generating a clock signal, comprising:
generating first and second signals having respective first and second phases from a reference signal having a reference phase;
generating the clock signal equal to the first signal and increasing a difference between the first and reference phases during a first mode when the first signal lags the second signal by less than one cycle of the reference signal; and
generating the clock signal equal to the second signal and increasing a difference between the second and reference phases during a second mode when the second signal lags the first signal by less than one cycle of the reference signal.

21. The method of claim 20, further comprising:
maintaining a substantially constant difference between the second and reference phases during the first mode; and
maintaining a substantially constant difference between the first and reference phases during the second mode.

22. The method of claim 20 wherein:
increasing the difference between the first and reference phases comprises increasing a delay between the first and reference signals by a predetermined amount each cycle of the reference signal during the first mode; and
increasing the difference between the second and reference phases comprises increasing a delay between the second and reference signals by the predetermined amount each cycle of the reference signal during the second mode.

23. The method of claim 20 wherein:
increasing the difference between the first and reference phases comprises increasing a delay between the first and reference signals by a predetermined amount at least once during the first mode; and
increasing the difference between the second and reference phases comprises increasing a delay between the second and reference signals by the predetermined amount at least once during the second mode.

24. The circuit of claim 7 wherein the second frequency is substantially the same as the first frequency.

25. The method of claim 16 wherein the second average frequency is substantially the same as the first average frequency.

* * * * *